United States Patent [19]

Nakagawa et al.

[11] Patent Number: 5,085,899
[45] Date of Patent: Feb. 4, 1992

[54] DUST-PROOF FILM

[75] Inventors: Hiroaki Nakagawa, Iwakuni; Yoichi Takehana, Tanashi, both of Japan

[73] Assignees: Mitsui Petrochemical Industries, Ltd.; Hitachi, Ltd., both of Tokyo, Japan

[21] Appl. No.: 228,577

[22] Filed: Aug. 5, 1988

[30] Foreign Application Priority Data

Aug. 18, 1987 [JP] Japan .................. 62-205533

[51] Int. Cl.$^5$ .............................................. A47G 1/12
[52] U.S. Cl. ............................... 428/14; 156/60; 355/122; 428/45
[58] Field of Search ............. 428/14, 33, 34, 45, 428/64, 68; 156/60; 355/122, 125

[56] References Cited

U.S. PATENT DOCUMENTS

| | | | |
|---|---|---|---|
| 2,165,539 | 7/1939 | Dahlgren | 206/460 |
| 2,888,368 | 5/1959 | Grantham | 428/509 |
| 3,082,453 | 3/1963 | Mutchler et al. | 206/447 X |
| 4,470,508 | 9/1984 | Yen | 428/40 X |
| 4,476,172 | 10/1984 | Ward | 428/38 |
| 4,482,591 | 11/1984 | Ward | 428/66 |
| 4,537,813 | 8/1985 | Kuyel | 428/209 |
| 4,737,387 | 4/1988 | Yen | 428/45 X |
| 4,759,990 | 7/1988 | Yen | 428/421 |
| 4,764,421 | 8/1988 | Horiki et al. | 428/40 X |

FOREIGN PATENT DOCUMENTS 0252574 1/1988 European Pat. Off. ............ 428/14
60-502121 12/1985 Japan .................................. 428/14

OTHER PUBLICATIONS

Patent Abstracts of Japan, vol. 11, No. 91 (P-558) [2538], Mar. 23, 1987 (Abstract of Japan Pub. Pat. Appln. 61-241756).

Patent Abstracts of Japan, vol. 9, No. 190 (P-378) [1913], Aug. 7, 1985 (Abstract of Japan Pub. Pat. Appln. 60-57841).

Patent Abstracts of Japan, vol. 9, No. 214 (P-384) [1937], Aug. 31, 1985 (Abstract of Japan Pub. Pat. Appln. 60-75835).

Primary Examiner—Henry F. Epstein
Attorney, Agent, or Firm—Sherman & Shalloway

[57] ABSTRACT

A dust-proof film comprising a pellicle frame and a pellicle film spread on one side face of the frame, which is attached to a photomask, a reticle or the like to prevent a foreign substance from adhering to a pattern, wherein a paint is coated on the inner side face of the pellicle frame to form a coating layer, whereby a generation of dust from a surface of the pellicle frame is prevented.

8 Claims, 2 Drawing Sheets

DUST-PROOF FILM

BACKGROUND OF THE INVENTION

1. Field of the Invention

The present invention relates to a dust-proof film (hereinafter referred to as "pellicle") which is used for preventing a foreign substance such as dust from adhering to a photomask, a reticle or the like (hereinafter referred to as "mask") used at the lithographing step in the process of fabricating a semiconductor device such as an IC or LSI.

2. Description of the Related Art

At the lithographing step, a mask comprising a glass sheet and a circuit pattern of a vacuum deposition film of chromium or the like formed on the surface of the glass sheet is used, and the circuit pattern is transferred to a resist-coated silicon wafer. At this step, if light exposure is carried out when a foreign substance such as dust is adhered to the circuit pattern on the mask, the foreign substance is transferred to the wafer and a defective product is formed. Especially when light exposure is carried out by using a stepper, the risk that all of the chips formed on a wafer will be defective is increased, and adhesion of a foreign substance to a circuit pattern of a mask or the like is a serious problem. Therefore, as a means of eliminating this problem, a pellicle has recently been developed and used.

In general, the pellicle comprises a transparent film or the like spread on one side face of a pellicle frame composed of aluminum, a double-adhesive tape is applied to the other side face of the pellicle frame, and the pellicle is attached to a mask. If this pellicle is used, the intrusion of a foreign substance from the outside can be prevented, and even if a foreign substance adheres to the film, the foreign substance is transferred in the fuzzy state during light exposure and no particular problem arises. Nevertheless, where a foreign substance adheres to the inner face of the film or pellicle frame, if vibration or shock is generated, for example, during an exchange of the mask on the light exposure apparatus, the foreign substance may drop onto the mask, resulting in the formation of defective products.

Japanese Unexamined Patent Publication (Kokai) No. 60-502121 discloses a method in which a protecting cover is applied to the bonding face on the mask side of the pellicle frame. But, when the protecting cover is peeled at the time of using the pellicle, the pressure of the interior is reduced and sometimes a foreign substance is engulfed therein together with air. Accordingly, with the increase of the integration degree in a semiconductor device and the reduction of the allowable size of a foreign substance, it is feared that even a fine foreign substance having a size of 1 to 2 $\mu$m or less will cause a problem.

The inventors found that, when a clean pellicle is attached to a mask after confirmation of the absence of a foreign substance adhering to the inner side of the film or pellicle, sometimes a foreign substance, not observed before the attachment, adheres to the mask. To clarify the cause of this undesirable phenomenon, the inventors carefully examined the interior of a pellicle, and as a result, found that fine convexities and concavities, as shown in FIG. 2, are formed on an alumetized aluminum frame customarily used for the pellicle, and that the section of a double-adhesive tape customarily used for bonding the pellicle to a mask is porous, as shown in FIG. 3. Moreover, it was found that a foreign substance contained in such a dent causes a generation of dust upon vibration or shock, and it is very difficult to detect or remove a foreign substance of this type. Accordingly, it was concluded that, even if a pellicle having no foreign substance on the surface is obtained and an intrusion of a foreign substance from the outside is completely prevented, a generation of dust cannot be prevented in the conventional structure.

SUMMARY OF THE INVENTION

Accordingly, the objects of the present invention are to eliminate the above-mentioned disadvantages of the prior art and to provide a dust-free pellicle in which a generation of dust is completely prevented even under vibration or shock.

Other objects and advantages of the present invention will be apparent from the following description.

In accordance with the present invention, there is provided a dust-proof film comprising a pellicle frame and a pellicle film spread on one side face of the frame, which is attached to a photomask, a reticle or the like to prevent a foreign substance from adhering to a pattern, wherein a paint is coated on the inner side face of the pellicle frame to form a coating layer, whereby a generation of dust from a surface of the pellicle frame is prevented.

In accordance with the present invention, there is also provided a dust-proof film comprising a pellicle frame and a pellicle film attached to one side face of the pellicle frame, which is attached to a photomask, a reticle or the like by a double-adhesive tape comprising a foamed substrate and adhesive layers formed on both surfaces of the foamed substrate, to prevent a foreign substance from adhering to a pattern wherein, of the inner section of the double-adhesive tape, at least the section of the foamed substrate is coated with a paint.

In accordance with the present invention, there is further provided a dust-proof film comprising a pellicle frame and a pellicle film spread on one side face of the frame, which is attached to a photomask, a reticle or the like to prevent a foreign substance from adhering to a pattern, wherein the pellicle is attached to a mask by a double-adhesive tape comprising an unfoamed substrate and adhesive layers formed on both surfaces of the substrate.

In accordance with the present invention, there is further provided a dust-proof film comprising a pellicle frame and a pellicle film spread on one side face of the frame, which is attached to a photomask, a reticle or the like to prevent a foreign substance from adhering to a pattern, wherein a tackifier is directly coated on the bonding face on the other side face of the pellicle frame and the pellicle is bonded to a mask through the coated tackifier.

BRIEF DESCRIPTION OF THE DRAWINGS

The present invention will be better understood from the description set forth below with reference to the accompanying drawings, in which.

DESCRIPTION OF THE PREFERRED EMBODIMENTS

Figure 1:
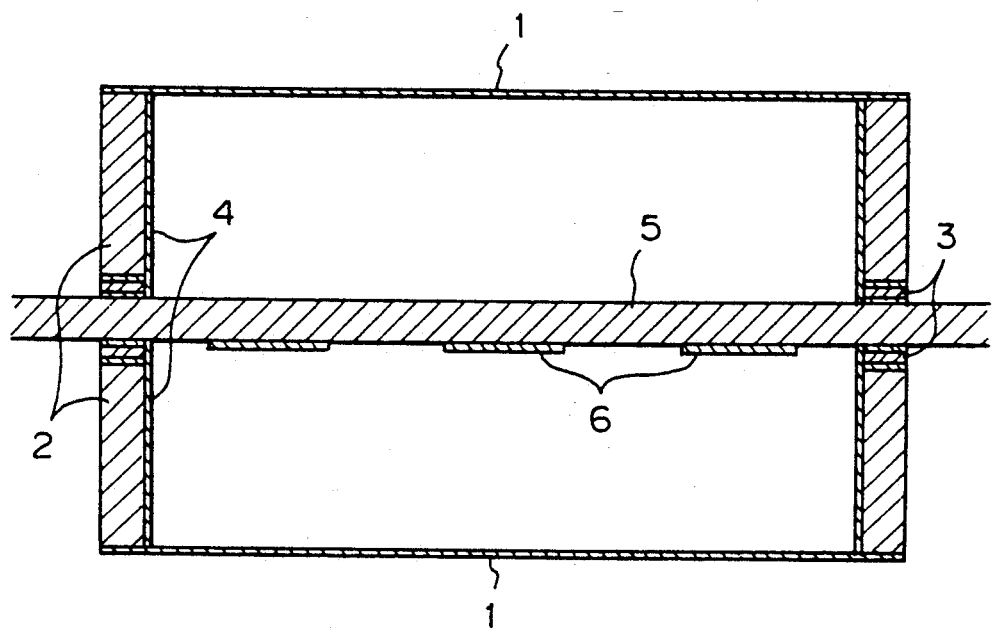
FIG. 1 is a sectional view of a pellicle according to one embodiment of the present invention.
Figure 2:
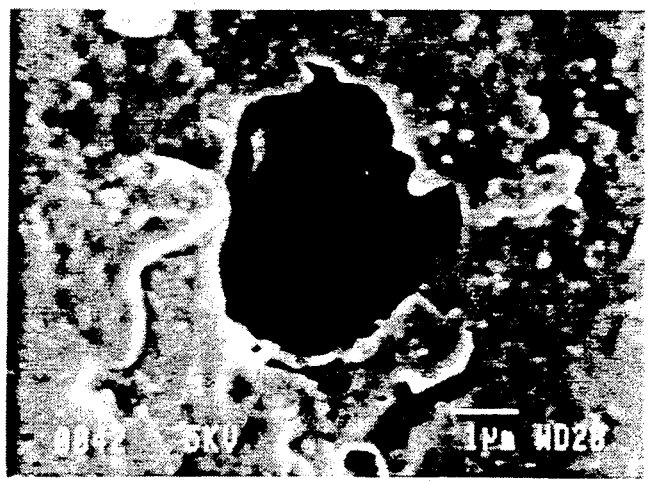
FIG. 2 is a microscope photograph of the surface of an alumetized aluminum frame; and, FIG. 3 is a microscope photograph showing the section of a double-adhesive tape.
Figure 3:
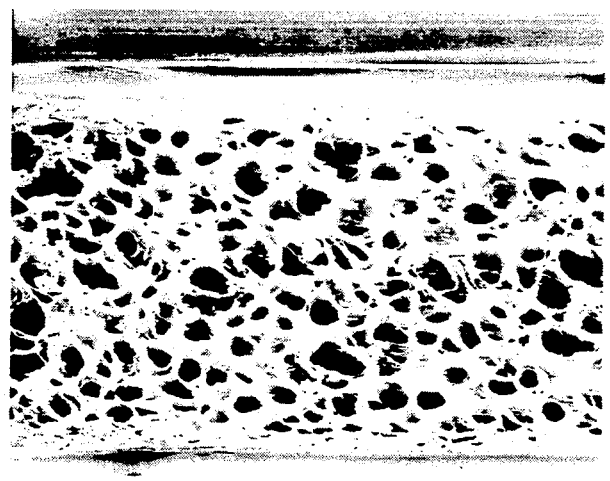

According to the first aspect of the present invention, there is provided a pellicle in which the entire inner face of a pellicle frame is coated with a paint to confine a foreign substance contained in a dent and prevent the foreign substance from exiting from the dent. More specifically, in accordance with the first aspect of the present invention, there is provided a pellicle comprising a pellicle frame and a pellicle film spread on one side face of the frame, which is attached to a mask to prevent a foreign substance from adhering to a pattern, wherein a paint is coated on the inner side face of the pellicle frame to form a coating layer, whereby a generation of dust from the surface of the pellicle frame is prevented.

The paint referred to herein includes oily paints, aqueous paints, resin paints, ordinary pigment-containing paints used for a surface protection of metals or coloration, paints used for special purposes, for example, conduction of heat, conduction of electricity, and adjustment of absorption or reflection of light, adhesives, tackifiers, and other substances that will not peel and can prevent a generation of dust when coated on the pellicle frame. Among the above, electroconductive substances, especially tackifiers, are most preferred. If a paint composed of an electro-conductive substance is used, dust is easily drawn in by electrification, and an accidental isolation of the foreign substance, which is often observed when the foreign substance is ordinarily adsorbed, can be prevented when an electroconductive substance is used (the foreign substance adsorbed by a static charge is rarely isolated). Furthermore, when a tackifier is used, the following effect is attained in addition to the inherent effect of preventing a generation of dust from the frame. Namely, an inspection of the presence of a foreign substance on the inner side face of the frame is performed with the naked eye just before use of the pellicle (automatic inspection is very difficult), and where a foreign substance has been overlooked, a foreign substance having such a small size that inspection with the naked eye is difficult is present, or a foreign substance intrudes after the inspection but before the attachment to a mask and adheres to the inner side face of the frame, such a foreign substance can be prevented from dropping onto the mask and the inspection for a foreign substance upon attachment to the mask can be omitted.

Although inorganic and organic tackifiers are known, an organic tackifier is ordinarily used. If a low-boiling-point substance (having a boiling point lower than 150° C.), such as toluene or ethyl acetate, is contained in the organic tackifier, the total amount of such low-boiling-point substances should be smaller than 0.0001 mole. If the amount of the low-boiling-point substance is 0.0001 mole or larger, the thickness of the film is increased and the transmission is reduced.

Flowing of the paint should be avoided during storage or transportation, and accordingly, preferably a paint having a flow point higher than 50° C. is used.

Moreover, preferably, a paint which is not decomposed or deteriorated by light having a wavelength of 250 to 450 nm, which is used for the light exposure, is used.

As the paint-coating means, there can be mentioned a method of coating an emulsion paint or pasty paint and a spray-coating method. An alumetized aluminum frame customarily used and a frame of another material having a dust-generating property can be used as the pellicle frame.

According to the second aspect of the present invention, the inner section of a double-adhesive tape is coated with a paint for preventing a generation of dust from the double-adhesive tape. More specifically, in accordance with the second aspect of the present invention, there is provided a pellicle comprising a pellicle frame and a pellicle film spread on one side face of the frame, which is attached to a photomask, a reticle or the like by a double-adhesive tape comprising a foamed substrate and adhesive layers formed on both the surfaces of the foamed substrate, to prevent a foreign substance from adhering to a pattern, wherein, on the inner side face of the double-adhesive tape, at least the section of the foamed substrate is coated with a paint.

The same paints as described hereinbefore with respect to the first aspect of the present invention also can be used in the second aspect of the present invention.

A double-adhesive tape is ordinarily used for attaching a pellicle to a mask because the double-adhesive tape has a good adhesion and a certain elasticity required for bonding. Where a paint is coated on a section of the double-adhesive tape for preventing a generation of dust from the double-adhesive tape, as in the second aspect of the present invention, when the pellicle is pressed to a mask for bonding, the double-adhesive tape is compressed and there is a risk of a squeezing out of the coated paint onto the mask surface.

The third aspect of the present invention is characterized in that, to solve the above-mentioned problem, an unfoamed substrate is used as the substrate of the double-adhesive tape instead of the foamed substrate. More specifically, in accordance with the third aspect of the present invention, there is provided a pellicle comprising a pellicle frame and a pellicle film spread on one side face of the frame, which is attached to a photomask, a reticle or the like to prevent a foreign substance from adhering to a pattern, wherein the pellicle is attached to a mask by a double-adhesive tape comprising an unfoamed substrate and adhesive layers formed on both surfaces of the substrate.

Sheets of resins or rubbers, especially thin sheets of polyethylene or the like, are used as the unfoamed substrate.

Where an adhesive tape is used, the width of the tape should be equal to or slightly smaller than the width of the end face of the frame. If the width of the tape is larger than the width of the end face of the frame and the tape protrudes at the inner side, the light exposure is influenced by the adhesive tape, and if the tape protrudes at the outer side, handling becomes difficult. In contrast, if the adhesive tape is too small, the bonding area is reduced and the sealing property is degraded. If the thickness of the sheet is reduced, cutting of the double-adhesive tape to a predetermined width can be facilitated, and a paint as mentioned above can be applied to the section of the sheet. An adhesive having a good elasticity can be used as the adhesive to be coated on both surfaces of the sheet imparting an elasticity to the tape.

The fourth aspect of the present invention is characterized in that a pellicle is attached by a tackifier directly applied to the side face instead of the double-adhesive tape. More specifically, in accordance with the present invention, there is provided a pellicle comprising a pellicle frame and a pellicle film spread on one side face of the frame, which is attached to a photomask, a reticle or the like to prevent a foreign substance from adhering to a pattern, wherein a tackifier is directly coated on the bonding face on the other side face of the pellicle frame and the pellicle is bonded to a mask through the coated tackifier.

Preferably, a tackifier having a hardness of about 3° to about 70° C. JIS A type rubber hardness meter is used, and preferably the thickness of the layer of the tackifier is about 0.1 to about 3 mm. If the hardness is lower than 3°, the tackifier is too soft and the operation is difficult. If the hardness is higher than 70°, the tackifier is too hard and the bond-sealing property is drastically degraded. If the thickness of the layer of the coated tackifier is smaller than 0.1 mm, the bonding area is reduced and the bond-sealing property is drastically degraded. If the thickness of the layer of the tackifier is larger than 3 mm, the layer protrudes at the inner or outer side of the frame at the bonding step, and the pellicle becomes sticky at the time of use and handling becomes difficult. Table 1 illustrates the relationship between the thickness of the tackifier layer and the bonding area obtained when the pellicle is attached to the mask. In Table 1, the bonding area (%) means the ratio of the area of the bonded portion of the side face of the frame to the tackifier-applied area.

In the second, third, and fourth aspects of the present invention, as in the first aspect of the present invention, preferably a paint is coated on the inner side face of the pellicle frame, whereby a generation of dust from the pellicle can be better prevented.

FIG. 1 illustrates an embodiment using a pellicle having the entire inner side face coated with a tackifier 4 in the region of from a pellicle frame 2 having a pellicle film 1 spread on one side face to a double-adhesive tape 3 attached to the other side face. This pellicle is attached to the front and back faces of a mask 5 to surround a pattern circuit 6.

EXAMPLES

The present invention will now be further illustrated by, but is by no means limited to, the following Examples.

EXAMPLE 1

A pellicle film was spread on one side face of an alumetized aluminum frame and a double-adhesive tape was applied to the bonding face of the other side face of the pellicle frame. A tackifier was coated on the entire inner side face of the pellicle in the region extending to the double-adhesive tape. Then, the pellicle was attached to a washed quartz substrate, and the number of foreign substances having a size larger than 1 $\mu$m, which were present on the substrate, was checked. The assembly was allowed to fall 4 times from a height of 3 cm, and the increase or decrease of the number of foreign substances was examined. The results are shown in Table 2.

EXAMPLE 2

The same pellicle having the tackifier coated on the inner side face of the frame, as used in Example 1, was attached to a quartz substrate by using a double-adhesive tape. The increase or decrease of the number of foreign substances was examined in the same manner as described in Example 1. The results are shown in Table 2.

EXAMPLE 3

A double-adhesive tape was applied to the bonding face of a pellicle and a tackifier was coated only on the tape, and the pellicle was attached to a quartz substrate. The increase or decrease of the number of foreign substances was examined in the same manner as described in Example 1. The results are shown in Table 2.

COMPARATIVE EXAMPLE 1

The pellicle of Example 1, the inner side face of the frame, which was not coated with a tackifier, was attached to a quartz substrate by using a double-adhesive tape according to customary procedures. The increase or decrease of the number of the foreign substances was examined. The results are shown in Table 2.

EXAMPLE 4

A dust-free pellicle having the entire inner side face coated with a tackifier having a flow temperature of 30° or 60° C. was placed in a case and was allowed to stand in an automobile for one whole day and night. The pellicle was then taken out from the case. In the case of the tackifier having a flow temperature of 30° C., deformation of the bonded portion and migration of the tackifier to the film surface from the inner side face of the frame were observed, but in the case of the tackifier having a flow temperature of 60° C., these undesirable phenomena were not observed.

EXAMPLE 5

A pellicle having a film thickness of 0.865 $\mu$m was attached to a silicon wafer and allowed to stand for one week, and the change of the thickness was examined by using a film thickness-measuring apparatus (Model TFM-120 supplied by Oak Co.). The results are shown in Table 3.

TABLE 1

| Thickness of Tackifier Layer (mm) | Bonding Area (%) |
|---|---|
| 0.03 | 2–10 |
| 0.05 | 10–20 |
| 0.07 | 15–30 |
| 0.10 | 60–100 |
| 0.50 | 98–100 |
| 0.80 | 98–100 |
| 1.00 | 98–100 |

TABLE 2

| | | | Change of Number of Foreign Substances | | | | | |
|---|---|---|---|---|---|---|---|---|
| | Pellicle Frame | Double-Adhesive Tape | Run Number | | | | | Average Increase in Number |
| | | | 1 | 2 | 3 | 4 | 5 | |
| Example 1 | tackifier coated | tackifier coated | 1-1 | 2-2 | 2-1 | 3-2 | 1-1 | 0 |
| Example 2 | tackifier coated | tackifier not coated | 1-4 | 2-5 | 3-3 | 3-7 | 2-6 | 2.8 |
| Example 3 | tackifier not coated | tackifier coated | 1-3 | 2-2 | 3-3 | 2-5 | 1-3 | 1.4 |
| Comparative Example 1 | tackifier not coated | tackifier not coated | 2-8 | 2-2 | 3-9 | 1-6 | 1-5 | 4.2 |

TABLE 3

| Coated Amount (g) | Amount (mole) of Low-Boiling Point Substance | | | Total Amount (mole) of Low-Boiling-Point Substances | Change of Thickness (Å) |
|---|---|---|---|---|---|
| | 0.5% of toluene | 0.4% of butyl acetate | 0.3% of methyl-ethyl-ketone | | |
| 0.4 | 0.00003 | 0.00001 | 0.00002 | 0.00006 | 30 |
| 0.5 | 0.00004 | 0.00001 | 0.00003 | 0.00008 | 70 |
| 0.6 | 0.00005 | 0.00002 | 0.00003 | 0.00010 | 90 |
| 0.7 | 0.00005 | 0.00002 | 0.00004 | 0.00011 | 120 |
| 0.8 | 0.00006 | 0.00002 | 0.00004 | 0.00012 | 140 |
| | 0.6% of toluene | 0.6% of butyl acetate | 0.8% of methyl-ethyl-ketone | — | — |
| 0.5 | 0.00003 | 0.00003 | 0.00007 | 0.00013 | 150 |

We claim:

1. A dust-proof film comprising a pellicle frame and pellicle film attached to one side face of the pellicle frame, which is attached to a photmask by a double-adhesive tape comprising a foamed substrate and adhesive layers formed on both surfaces of the foamed substrate, to prevent an adherence of a foreign substance to a pattern, wherein a cutting section of the foamed substrate on the inner side of the double-adhesive tape and the entire surface of the inner side of the pellicle frame are coated with a paint having the following characteristics:
    (a) said paint is not decomposed or deteriorated by light having a wavelength of 250 to 450 nm;
    (b) said paint is electroconductive;
    (c) said paint is a tackifier;
    (d) said paint has a flow point of higher than 50° C.; and
    (e) said paint contains a low-boiling-point substance having a boiling point of less than 150° C. in a total amount of less than 0.0001 mole.

2. A dust-proof film as claimed in claim 1, wherein said photomask includes a reticle.

3. A dust-proof film comprising a pellicle frame and a pellicle film spread on one side face of the frame, which is attached to a photomask to prevent an adherence of a foreign substance to a pattern, wherein the pellicle is attached to a mask by a double-adhesive tape comprising an unfoamed substrate and adhesive layers formed on both surfaces of the substrate, and a paint is coated on the entire inner face of the pellicle frame, wherein said paint has the following characteristics;
    (a) said paint is not decomposed or deteriorated by light having a wavelength of 250 to 450 nm;
    (b) said paint is electroconductive;
    (c) said paint is a tackifier;
    (d) said paint has a flow point of higher than 50° C.; and
    (e) said paint contains a low-boiling-point substance having a boiling point of less than 150° C. in a total amount of less than 0.0001 mole.

4. A dust-proof film as claimed in claim 3, wherein the unfoamed substrate is a polyethylene sheet.

5. A dust-proof film as claimed in claim 3, wherein said photomask includes a reticle.

6. A dust-proof film comprising a pellicle frame and a pellicle film spread on one side face of the frame, which is attached to a photomask to prevent an adherence of a foreign substance to a pattern, wherein a tackifier is directly coated on the bonding face on the other side face of the pellicle frame and the pellicle is bonded to a mask through the coated tackifier, and a paint which has the following characteristics is coated on the entire inner face of the pellicle frame;
    (a) said paint is not decomposed or deteriorated by light having a wavelength of 250 to 450 nm;
    (b) said paint is electroconductive;
    (c) said paint is a tackifier;
    (d) said paint has a flow point of higher than 50° C.; and
    (e) said paint contains a low-boiling-point substance having a boiling point of less than 150° C. in a total amount of less than 0.0001 mole.

7. A dust-proof film as claimed in claim 6, wherein the thickness of the layer of the tackifier coated on the bonding face is 0.1 to 3 mm.

8. A dust-proof film as claimed in claim 6, wherein said photomask includes a reticle.

* * * * *